(12) United States Patent
Ito

(10) Patent No.: US 6,866,526 B2
(45) Date of Patent: Mar. 15, 2005

(54) ELECTRIC CONNECTION BOX

(75) Inventor: Norio Ito, Ogasa-gun (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 10/656,322

(22) Filed: Sep. 8, 2003

(65) Prior Publication Data

US 2004/0127077 A1 Jul. 1, 2004

(30) Foreign Application Priority Data

Sep. 9, 2002 (JP) .................................... P2002-262363

(51) Int. Cl.[7] .............................................. H01R 12/00
(52) U.S. Cl. ...................... 439/212; 174/72 C; 174/58; 439/76.1
(58) Field of Search ..................... 174/54, 58, 72 C, 174/72 TR; 361/752, 759, 796; 439/76.1, 76.2, 212; 220/3.3, 4.02

(56) References Cited

U.S. PATENT DOCUMENTS 4,963,099 A * 10/1990 Sato et al. .................. 439/76.2

* cited by examiner

Primary Examiner—Dhiru R. Patel
(74) Attorney, Agent, or Firm—Sughrue Mion, PLLC

(57) ABSTRACT

In an electric connection box constituted by arranging a bus bar circuit board constituted by arranging a plurality of bus bars having at least two kinds of different potentials on an insulating board in a vertical direction, in bus bar arrangement in which the bus bar having low potential and the bus bar having high potential are contiguously installed in a horizontal direction, the bus bar having the low potential is arranged on an upper side of the bus bar having the high potential in the vertical direction.

4 Claims, 4 Drawing Sheets

ELECTRIC CONNECTION BOX

The present invention is based on Japanese Patent Application No. 2002-262363, the entire contents of which are incorporated herein by reference.

BACKGROUND OF THE INVENTION

1. Field of the Invention

The present invention relates to an electric connection box for connecting wire harnesses to each other, particularly relates to an electric connection box capable of reducing portions of bringing about leakage between bus bars having different voltages.

2. Related Art

An electric connection box for connecting wire harnesses to each other is provided with a case main body comprising an upper case and a lower case, bus bar circuit boards are contained at inside of the case main body in a state of being laminated in the form of a number of layers and the electric connection box (bus bar circuit board) is arranged in a vertical direction. Each of the bus bar circuits which are actually used is constructed by a constitution as shown by FIG. 3 although not clearly disclosed as a technical literature. That is, a bus bar circuit board 1 is constituted by arranging a bus bar 3 for supplying low voltage and a bus bar 4 for supplying high voltage to an insulating board 2 constituted by an insulating material. Although not illustrated, the bus bar 3 and the bus bar 4 are provided with pluralities of branch tabs in a direction orthogonal to the bus bar circuit board 1, the branch tabs are projected to an outer face of the upper case or the lower case by penetrating tab inserting holes of the insulating board 2, contained to align at insides of various coupling portions of a connector coupling portion, a fuse coupling portion, a relay coupling portion and the like and connected to parts of a connector, a fuse, a relay and the like of wire harness terminals. The insulating board 2 includes a bus bar arranging groove which is formed to partition by a rib 5 opposed to a plate face thereof and the bus bar 3 and the bus bar 4 arranged to the bus bar arranging groove are fixed by welding bosses.

According to an embodiment of an electric connection box 20 of the invention illustrated in FIG. 1, a bus bar circuit board 1 constituted by arranging a plurality of bus bars 3 and 4 having at least two kinds of different potentials on an insulating board 2 is arranged vertically (in FIG. 1, arrange an upper side thereof to an upper side in a vertical direction) by arranging the electric connection box in a vertical direction and in arranging a bus bar 3A-1 and a bus bar 4A at which the bus bar 3 having low potential and the bus bar 4 having high potential are installed contiguous to each other in a horizontal direction, the bus bar 3A-1 having low potential is arranged on an upper side of the bus bar 4A having high potential in the vertical direction.

According to such a conventional bus bar circuit board 1, the bus bar 3 and the bus bar 4 are installed at the insulating board 2 without giving consideration to a potential difference of voltages respectively supplied thereto. Therefore, in the bus bar circuit board 1, the bus bar 3 and the bus bar 4 are not arranged on the insulating board 2 in a regular state.

In such a bus bar circuit board 1, when moisture invades inside of the electric connection box, leakage occurs at bus bar intervals 6A, 6B and 6C at which the bus bar 3 and the bus bar 4 arranged at the insulating board 2 are contiguous to each other. The occurrence of leakage at the bus bars produces an oxidation product of copper at the bus bars 3 and 4. The oxidation product of copper is frequently produced at the bus bar 4 supplying high voltage.

The oxidation product of copper is in a powder-like shape and therefore, as shown by FIG. 4 and FIG. 5, the oxidation product of copper flows between the bus bar 3 and the bus bar 4 by riding over the rib 5 at the bus bar intervals 6A, 6B and 6C by moisture 7 invading the electric connection box. Further, the oxidation product of copper is electrically conductive and therefore, when the oxidation product of copper flows by riding over the rib 5 at the bus bar intervals 6A, 6B, 6C and 6D along with the moisture, there is a concern that shortcircuit (shortcircuit) is brought and arc (spark) is generated between the bus bar 3 and the bus bar 4. When arc (spark) is generated in this way, there is a concern of effecting adverse influence on an element, apparatus or the like connected thereto.

Particularly, at the bus bar interval 6A illustrated in FIG. 3, there is a case in which the bus bar 4A having high voltage is arranged on an upper side of a position of the bus bar 3A-1 having low voltage in a vertical direction illustrated by an arrow mark. In this case, the oxidation product of copper produced at the bus bar 4A having high potential flows along with invading moisture, rides over the rib and flows to the side of the bus bar 3A-1 having low potential. Therefore, there is a possibility of bringing about shortage (shortage) and generating arc (spark) between the bus bars by presence of potential difference between the bus bar 4 and the bus bar 3 at the bus bar interval 6A.

SUMMARY OF THE INVENTION

It is an object of the invention to provide an electric connection box capable of reducing production of an oxidation product of copper at a bus bar and preventing arc (spark) from being generated between bus bars.

(1) In order to resolve the above-described problem, an electric connection box according to the invention is characterized in an electric connection box for arranging a bus bar circuit board constituted by arranging a plurality of bus bars having at least two kinds of different potentials on an insulating board in a vertical direction, wherein in a bus bar arrangement in which a bus bar having a low potential and a bus bar having a high potential are installed to be contiguous to each other in a horizontal direction, the bus bar having the low potential is arranged on an upper side of the bus bar having the high potential in the vertical direction.

By constituting in this way, according to the invention, an oxidation product of copper produced at the bus bar having the high potential does not flow by invading moisture to a side of the bus bar having the low potential and therefore, generation of arc (spark) between the bus bars can be prevented.

(2) In order to resolve the above-described problem, an electric connection box of the invention is characterized in an electric connecticon box for arranging a bus bar circuit board constituted by arranging a plurality of bus bars having at least two kinds of different potentials on an insulating board in a vertical direction, wherein a region of the insulating board for arranging the plurality of bus bars is arranged to partition by a first area for wiring a first bus bar having a low potential and a second area for wiring a second bus bar having a high potential.

By constituting in this way, according to the invention, production of the oxidation product of copper at the bus bar is reduced and generation of arc (spark) between the bus bars can be prevented.

(3) In order to resolve the above-described problem, an electric connection box according to the invention is characterized in an electric connection box for arranging a bus bar circuit board constituted by arranging a plurality of bus bars having at least two kinds of different potentials on an insulating board in a vertical direction, wherein a region of the insulating board for arranging the plurality of bus bars is partitioned by a first area having a low potential and a second area having a high potential and in arranging the first area to the insulating board, the first area is arranged to dispose on an upper side of the second area in the vertical direction.

By constituting in this way, according to the invention, the area of arranging the bus bar having the low potential is separated from the area of arranging the bus bar having the high potential and is arranged on the upper side of the area of arranging the bus bar having the high potential in the vertical direction and therefore, the oxidation product of copper produced at the bus bar having the high potential does not flow to the side of the bus bar having the low potential and therefore, generation of arc (spark) between the bus bars can be prevented.

DETAILED DESCRIPTION OF THE PREFERRED EMBODIMENT

An embodiment of the invention will be explained in reference to the drawings as follows.

Figure 1:
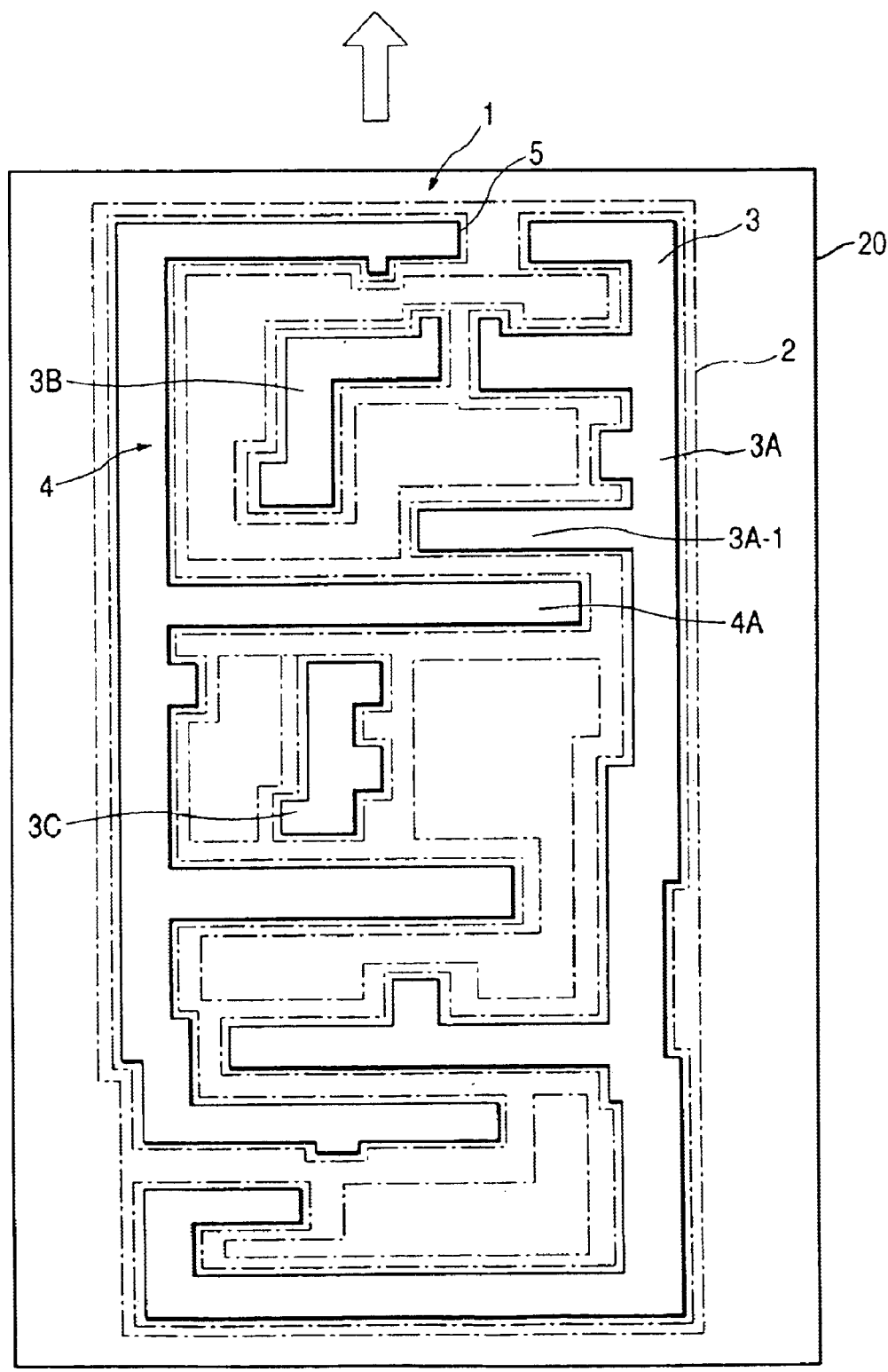
FIG. 1 is a front view of a bus bar circuit board showing an embodiment of an electric connection box according to the invention.

FIG. 1 shows a bus bar circuit board showing an embodiment of an electric connection box according to the invention.

According to an embodiment of an electric connection box of the invention illustrated in FIG. 1, a bus bar circuit board 1 constituted by arranging a plurality of bus bars 3 and 4 having at least two kinds of different potentials on an insulating board 2 is arranged vertically (in FIG. 1, arrange an upper side thereof to an upper side in a vertical direction) by arranging the electric connection box in a vertical direction and in arranging a bus bar 3A-1 and a bus bar 4A at which the bus bar 3 having low potential and the bus bar 4 having high potential are installed contiguous to each other in a horizontal direction, the bus bar 3A-1 having low potential is arranged on an upper side of the bus bar 4A having high potential in the vertical direction.

Figure 3:
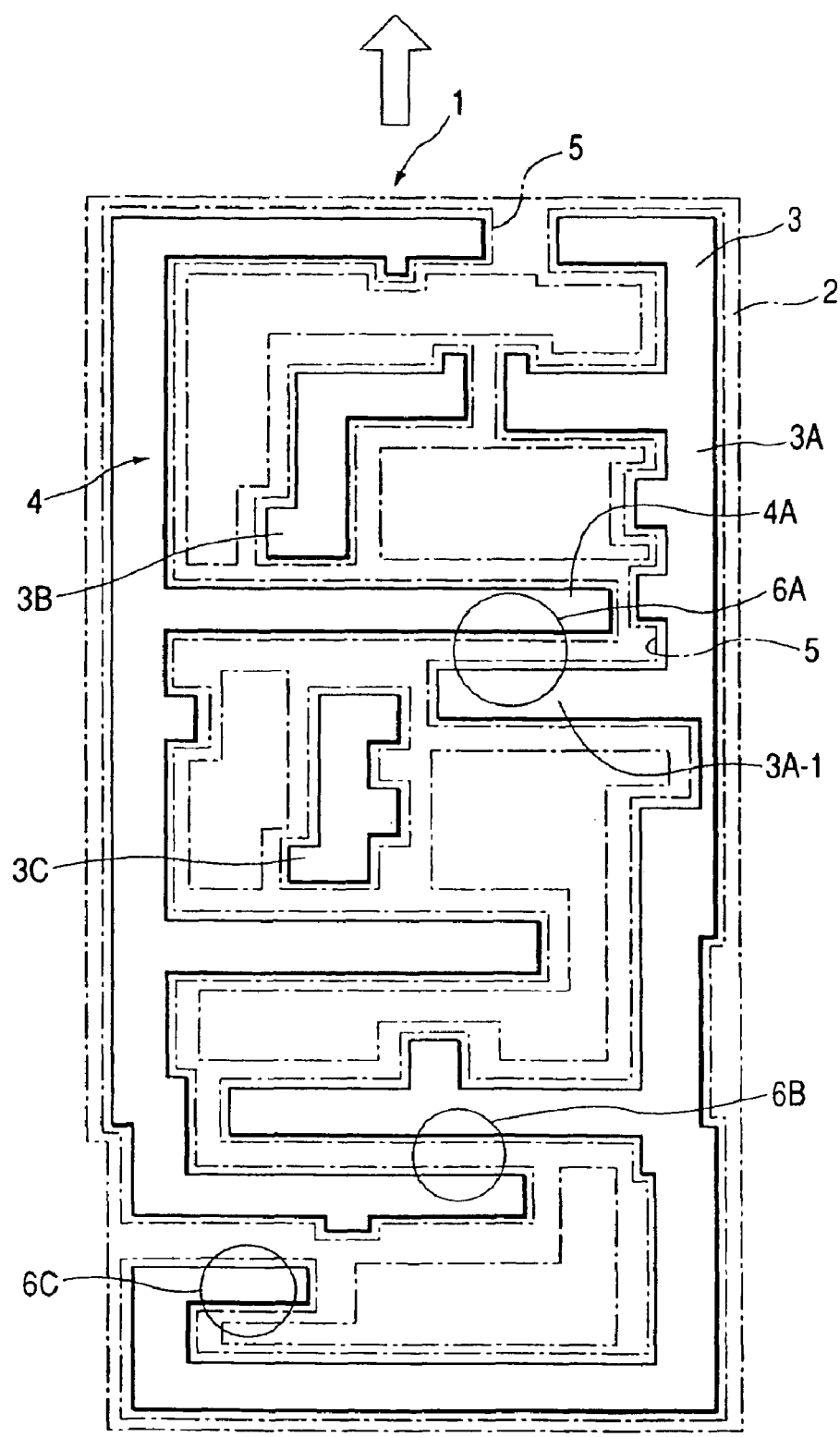
FIG. 3 is a front view of a bus bar circuit board of a conventional electric connection box.
Figure 4:
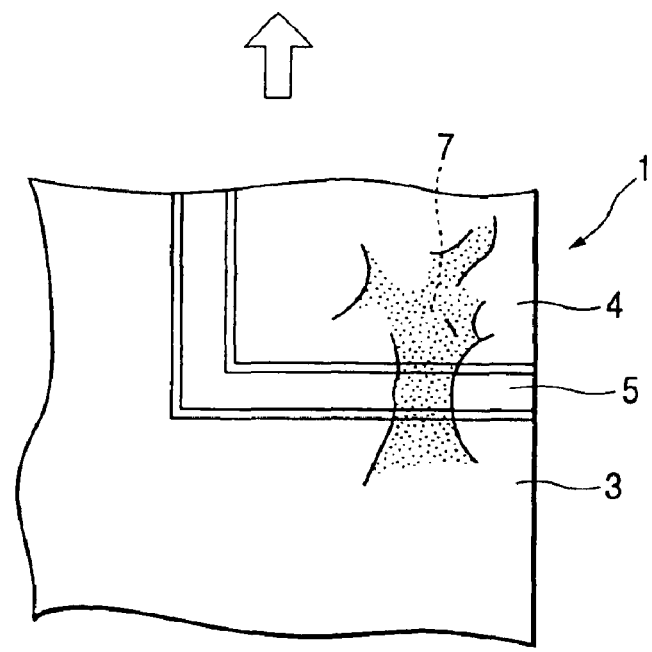
FIG. 4 is a front view showing a state in which moisture flows between bus bars illustrated in FIG. 3.
Figure 5:
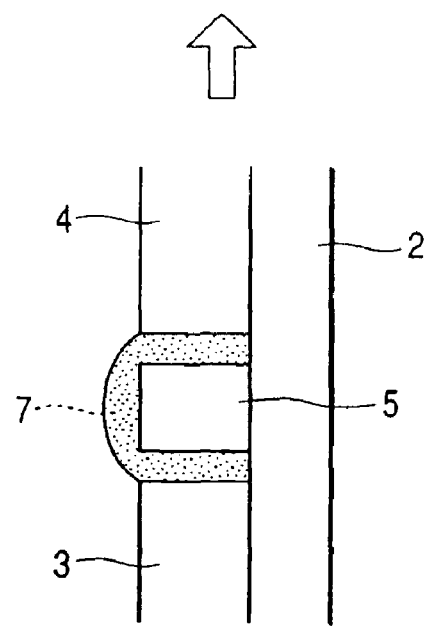
FIG. 5 is a sectional view of illustration of FIG. 4.

That is, in FIG. 1, in arranging the bus bar 3A-1 and the bus bar 4A of the bus bar circuit board 1, the bus bar 3A-1 having low potential is arranged on the upper side of the bus bar 4A having high potential in the vertical direction. This differs from the arrangement relationship of the bus bar 3A-1 and the bus bar 4A of the bus bar circuit board 1 shown as the conventional example illustrated in FIG. 3. That is, according to the arrangement relationship between the bus bar 3A-1 and the bus bar 4A of the bus bar circuit board 1 shown as the conventional example illustrated in FIG. 3, the bus bar 4A having high potential is arranged on the upper side of the position of the bus bar 3A-1 having low potential in the vertical direction. The design of arranging the bus bar 3A-1 and the bus bar 4A of the conventional example is changed and; the bus bar 3A-1 having low potential is arranged on the upper side of the bus bar 4A having high potential in the vertical direction.

Therefore, according to the embodiment, the oxidation product copper produced at the bus bar 4A having high potential can be prevented from flowing to the side of the bus bar 3A-1 supplying low voltage.

Figure 2:
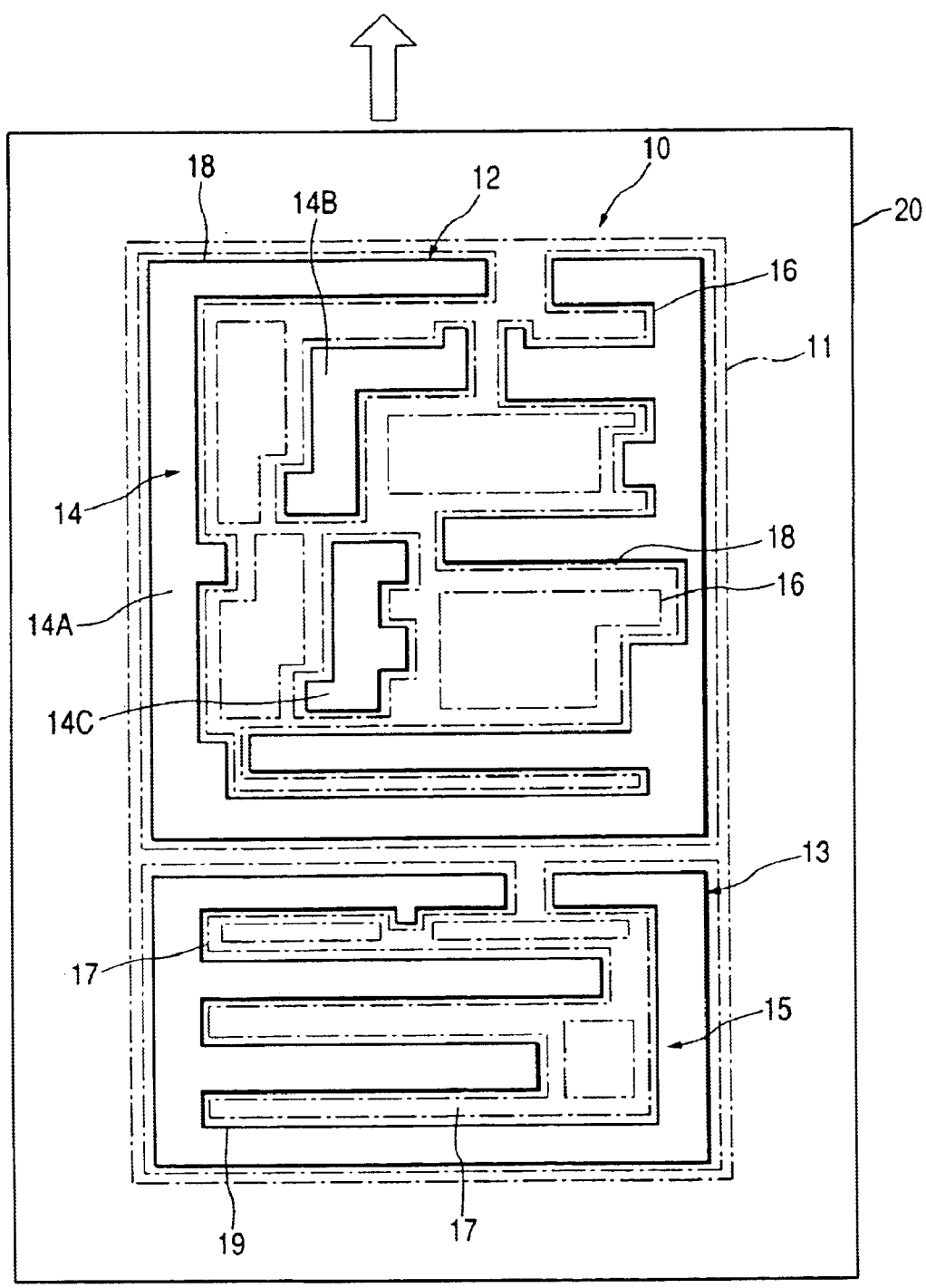
FIG. 2 is a front view of a bus bar circuit board showing other embodiment of an electric connection box according to the invention.

FIG. 2 shows a bus bar circuit board showing other embodiment of an electric connection bar 20 according to the invention.

According to other embodiment of the electric connection box of the invention illustrated in FIG. 2, a bus bar circuit board constituted by arranging a plurality of bus bars having at least two kinds of different potentials on an insulating board is arranged in a vertical direction, a region of the insulating board for arranging the plurality of bus bars is partitioned by a first area having low potential and a second area having high potential and in arranging the first area at the insulating board, the first area is arranged on an upper side of the second area in a vertical direction shown by an arrow mark illustrated.

In FIG. 2, a bus bar circuit board 10 includes an insulating board 11 constituted by an insulating material and the insulating board 11 is provided with a first area 12 having low potential and a second area 13 having high potential. The first area 12 and the second area 13 are arranged such that the first area is arranged on an upper side of the second area in the vertical direction as an arrangement relationship on the insulating board 11. Further, the first area 12 is arranged with a bus bar 14 having low potential. In FIG. 2, the bus bar 14 comprises three bus bars of bus bars 14A, 14B and 14C. That is, the first area 12 is provided with a plurality of the bus bars 14A, 14B and 14C having low potential.

Further, the second area 13 is arranged with a bus bar 15 having high potential. In FIG. 2, the bus bar 15 is constituted by a single piece of bus bar a total of which is continuous.

The insulating board 11 includes bus bar arranging grooves 18 and 19 formed to partition by ribs 16 and 17 respectively opposed to plate faces thereof and the bus bar 14 and the bus bar 15 arranged at the bus bar arranging grooves 18 and 19 are fixed by welding bosses, not illustrated.

Therefore, according to the embodiment, the area of arranging the bus bar having low potential is separated from the area of arranging the bus bar having high potential and arranged on an upper side of the area of arranging the bus bar having high potential in the vertical direction and therefore, the oxidation product of copper produced at the bus bar having high potential does not flow to the side of the bus bar supplying low voltage and therefore, production of the oxidation product of copper is reduced at the bus bars 14 and 15 and generation of arc (spark) between the bus bars 14 and 15 can be prevented.

The invention is constituted as described above and therefore, the following effect is achieved.

According to the invention, the oxidation product of copper produced at the bus bar having the high potential does not flow to the side of the bus bar having the low potential by invading moisture and therefore, generation of arc (spark) between the bus bars can be prevented.

According to the invention, production of the oxidation product of copper at the bus bar is reduced and generation of arc (spark) between the bus bars can be prevented.

According to the invention, the area of arranging the bus bar having the low potential is separated from the area of arranging the bus bar having the high potential and is arranged on the upper side of the area of arranging the bus bar having the high potential in the vertical direction and therefore, the oxidation product of copper produced at the bus bar having the high potential does not flow to the side of the bus bar having the low potential and therefore, generation of arc (spark) between the bus bars can be prevented.

What is claimed is:

1. An electric connection box comprising:

an insulating board disposed along a vertical direction and having a front face;

a first bus bar having a lower potential provided on said front face of said insulating board; and a second bus bar having a higher potential provided on said front face of said insulating board, wherein said first bus bar is on an upper side of said second bus bar in the vertical direction so as to be adjacent to each other.

2. An electric connection box according to claim 1, wherein said first bus bar and said second bus bar extend substantially in a horizontal direction.

3. An electric connection box comprising:

an insulating board disposed along a vertical direction and having a front face, a first bus bar having a lower potential; and a second bus bar having a higher potential, wherein said front face of insulating board is partitioned into at least a first area on which said first bus bar is provided and a second area on which said second bus bar is provided.

4. An electric connection box comprising:

an insulating board disposed along a vertical direction and having a front face, said front face of the insulating board being partitioned into at least a first area and a second area;

a first bus bar having a lower potential provided on said first area of said insulating board; and a second bus bar having a higher potential provided on said second area of said insulating board, wherein said first area is provided on an upper side of said second area in the vertical direction.

* * * * *